United States Patent [19]
Lin et al.

[11] Patent Number: 5,523,186
[45] Date of Patent: Jun. 4, 1996

[54] SPLIT AND COVER TECHNIQUE FOR PHASE SHIFTING PHOTOLITHOGRAPHY

[75] Inventors: Burn J. Lin, Tampa, Fla.; Donald J. Samuels, Yorktown, N.Y.

[73] Assignee: International Business Machines Corporation, Armonk, N.Y.

[21] Appl. No.: 357,889

[22] Filed: Dec. 16, 1994

[51] Int. Cl.$^6$ ........................................... G03F 9/00
[52] U.S. Cl. .................. 430/5; 430/311; 430/312; 430/394
[58] Field of Search ................. 430/5, 311, 312, 430/394

[56] References Cited

U.S. PATENT DOCUMENTS 5,308,741  5/1994  Kemp ........................................ 430/312

OTHER PUBLICATIONS

"Improving Resolution in Photolithography with a Phase–Shifting Mask", M. Levenson et al., IEEE Transactions on Electron Devices, vol. ED–29, No. 12, Dec. 1982.

"Fabrication of 64M DRAM with i–Line Phase-Shift Lithography", K. Nakagawa et al., IEDM Tech. Digest, pp. 817–820, Jun. 1990.

"Transparent Phase shifting Mask", H. Watanabe et al. IEDM Tech. Digest, pp. 821–824, Jun. 1990.

"0.2 um or Less i–Line Lithography by Phase-Shifting-–Mask Technology", H. Jinbo et al, IEDM Tech. Digest, pp. 825–828, Jun. 1990.

*Primary Examiner*—S. Rosasco
*Attorney, Agent, or Firm*—Perman & Green

[57] ABSTRACT

A photolithographic technique and apparatus involving two exposures and the sectioning of a first original mask opening that has segments which conflict with a second original mask opening. A plurality of segmented openings are configured in a first mask including at least one phase shifted opening and at least one non-phase shifted opening. Imaging radiation is projected through the plurality of segmented openings onto at least two electromagnetic radiation application regions (EARs) on a surface to be imaged during one exposure, with one of the two EAR's being phase shifted and the other non-phase shifted. At least one segmented opening is formed in a second mask. Radiation is projected through the second mask segmented opening onto one or more EARs on the surface during another exposure. At least one of the second mask EARs interconnects at least one of the phase shifted EARs and one of the non-phase shifted EARs. The first mask is a split mask, the second mask is a cover mask and both masks may be on a single mask substrate.

24 Claims, 11 Drawing Sheets

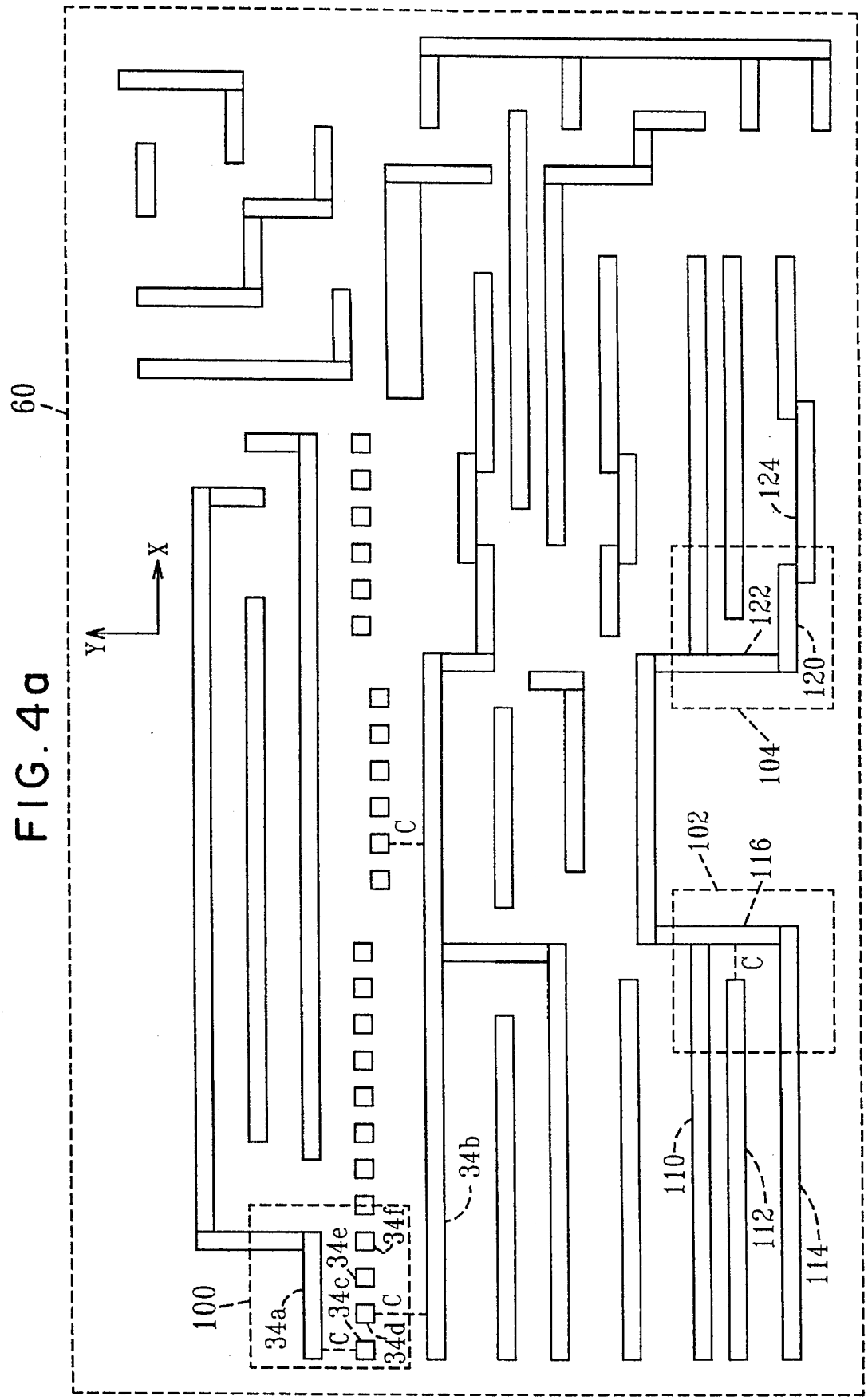

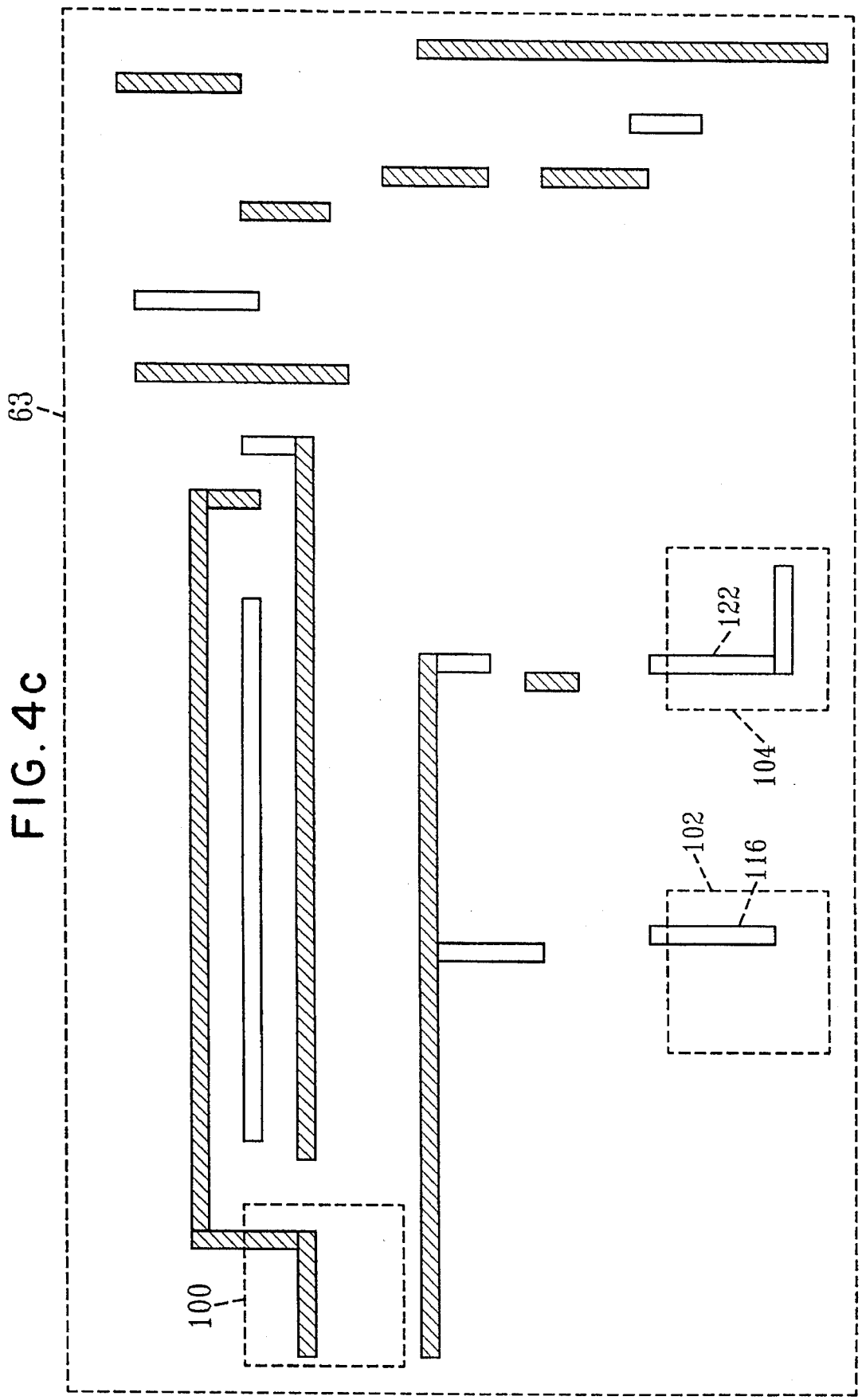

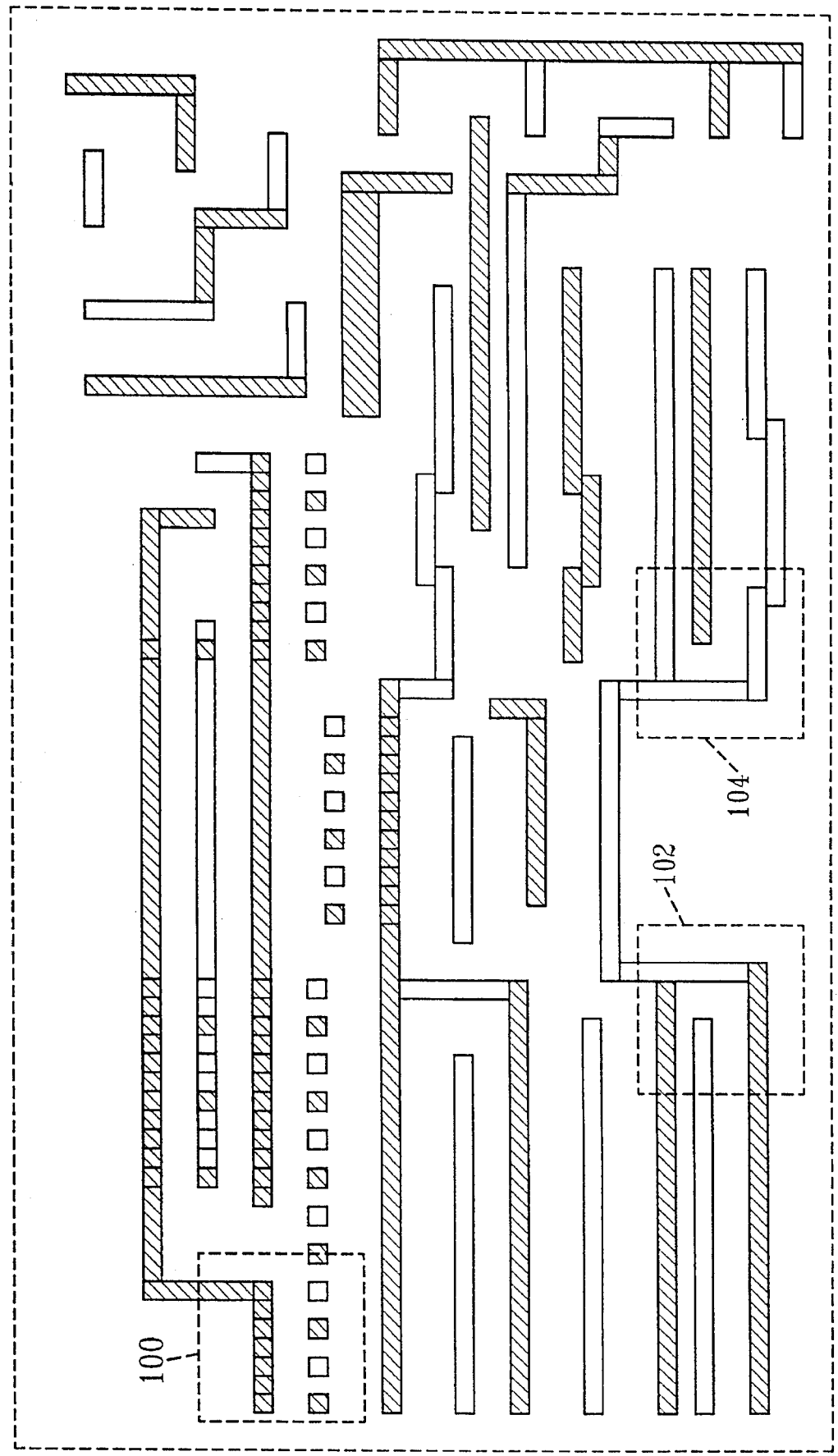

SPLIT AND COVER TECHNIQUE FOR PHASE SHIFTING PHOTOLITHOGRAPHY

FIELD OF THE INVENTION

The present invention relates to phase shifting photolithography in general, and more particularly to a phase shifting photolithography apparatus and technique used when multiple electromagnetic radiation application regions are applied to a workpiece surface, using a plurality of serially applied masks, and the edge of at least one of the electromagnetic radiation application regions is in very close proximity to an edge of another electromagnetic radiation application region.

BACKGROUND OF THE INVENTION

Photolithography is a well known technique used to apply patterns on the surface of a workpiece, such as a circuit pattern to a semiconductor chip or wafer, and which is also capable of producing very small, intricate patterns for many other applications. Traditional photolithography involves applying electromagnetic radiation to a mask having openings formed therein such that the light or radiation that passes through the openings is applied to a region on the surface of the workpiece. The surface regions are referred to herein as "electromagnetic radiation application regions".

The workpiece surface is typically coated with a photoresist such that the electromagnetic radiation application regions (hereinafter referred to as "EAR"s) where electromagnetic radiation is applied through the mask are selectively exposed or selectively left unexposed depending upon the properties of the photoresist. For a positive photoresist, regions which have electromagnetic radiation applied dissolve upon application of a developer solution, while regions which are not exposed do not dissolve in the developer. With negative photoresists the reverse occurs.

Photolithographic resolution is an important factor in determining a minimum dimension between openings in a mask which will provide unaffected spaces of a desired dimension between the EARs on the surface. When two adjacent or juxta-posed mask openings are too close, since the electromagnetic radiation travelling through each of the adjacent openings is diffracted the resulting fringes can cause constructive and destructive interference. This diffraction can diminish a dimension of the unaffected spaces formed on the workpiece surface, and under some circumstances may increase the intensity of the light radiation within these unaffected spaces.

As new generations of photolithographic techniques develop, the minimum dimensions of the EARs formed on the workpiece surface by photolithography become smaller, as do the minimum dimensions of the unaffected spaces between the EARs. In other words, the minimum dimensions of circuits formed by photolithographic processes generally decrease as improvements in semiconductor manufacturing processes occur. Improving photolithography technology provides improved resolution, resulting in a potential reduction of the minimum dimensions of EARs and the spaces between EARs. However, the process of developing and constructing masks capable of providing a higher resolution, as well as the development of the associated mask-making equipment, is expensive. It is desirable that the masking techniques associated with semiconductor chip manufacturing be able to reliably provide minimum sized unaffected spaces of smaller dimensions. In fact this has been, and still is, a highly desirable goal of photolithography in general.

Recent improvements in photolithographic masks often involve phase shifting techniques, in which certain of the openings, or portions of openings, are phase shifted with respect to adjacent openings. The openings in the mask are typically configured in an array of openings which are alternately phase shifting, and non-phase shifting, along two perpendicular axes of the mask. The electromagnetic radiation that passes through the phase shifting openings interferes destructively in the spaces with the electromagnetic radiation passing through the non-shifting openings, and thereby reduces the intensity of electromagnetic radiation within the unaffected spaces as described below. Recent improvements enable EARs and unaffected spaces to be formed with smaller dimensions. A related article, "Improving Resolution in Photolithography with Phase Shifting Masks", by Levenson et al., in IEEE Transactions on Electron Devices, Vol. ED-29, No. 12— December (1982), describes the photolithography process in general as well as the above-described specific form of photolithography. The specific type of photolithography described in the Levenson article is referred to in the present disclosure as "alternating phase shifting" photolithography.

Any mask configuration wherein any adjacent pair of EARs are spaced such a distance from each other as to permit electromagnetic radiation passing through the adjacent openings from interfering destructively with each other is suitable for phase shifting techniques. Any location on a mask where openings which are located closely adjacent to each other, and which are not correctly phase shifted relative to each other, is referred to herein as a conflict. Any mask with a conflict produces EARs with a poorly defined unaffected space therebetween.

Another technique which limits conflicts in photolithography is known as the orthogonal separation (hereinafter referred to as "OSEP") technique. OSEP limits many conflicts between two or more mask openings which extend perpendicular to each other. In OSEP techniques, all of the openings which extend primarily in a first direction are referred to as X component openings of the mask. The openings which extend primarily in a second direction, which is perpendicular to the first direction, are referred to as Y component openings of the mask. Since each X component opening extends primarily along the X direction, the possibility that an X component opening will interfere with a Y component opening is much higher than the possibility that the X component opening will interfere with another X component opening. The converse of the last sentence is also true. Therefore, the OSEP technique utilizes two masks defined as an X component mask and a Y component mask. The X component mask contains all, or almost all, of the X component openings. The Y component mask contains all, or almost all, of the Y component openings. The OSEP technique thereby limits the occurrences of conflict in complex mask layouts between X component openings and Y component openings. However, there are still some mask layout configurations which result in conflicts when OSEP techniques are used.

Alternating phase shifting techniques, as well as other types of phase shifting techniques which are known in the art, do improve the resolution of photolithographic masks in many layout configurations. The alternating phase shifting process functions best when the opening pattern formed on each mask is regular and repeatable. However, when the openings are staggered and irregular, it often becomes difficult to provide a mask layout which ensures that each opening is alternately phase shifted without conflicts with respect to each of its adjacent openings.

Several problems still have to be overcome to make the alternating phase shifting mask technique viable for use with arbitrary patterns. The first problem is that alternating phase shifting using light field masks often produces unwanted opaque images due to uncovered phase shifting open edges. The adverse effects of opaque image edges can, however, be limited by using only dark field masks with the resist polarity selected to suit the masks being used. The second problem is that when the patterns are unevenly spaced, certain adjacent phase shifting openings have different separations providing different levels of phase shifting improvement. The second problem can be overcome by combining alternating phase shifting technology with rim (Rim) techniques, or using attenuated (Att) and unattenuated (Utt) phase shifting techniques. Rim techniques are used where the openings are isolated far enough from each other so that conflicts between electromagnetic radiation passing through each opening is not a concern. The electromagnetic radiation passing through an opening adjacent each edge of the opening is phase shifted with respect to the electromagnetic radiation passing through the center of the opening. This configuration provides destructive interference for the electromagnetic radiation which strikes the surface at a region outside of where the electromagnetic radiation is intended to be directed. This destructive interference occurs between the electromagnetic radiation passing through the edges of the opening, and the electromagnetic radiation passing through the center of the opening. Rim technology further enhances the resolution of photolithography when openings are distantly spaced from each other.

The third problem with arbitrary two dimensional pattern layouts is that the alternating phase shifting process is not self-consistent. While the above described alternating phase shifting technology improves simpler mask layouts in general, it is desirable to make the alternating phase shifting technology applicable to masks with more complex and arbitrary layouts. It is desirable to apply alternating phase shifting masks in situations where a pair of laterally spaced overlapping openings overlap both of two or more longitudinally spaced openings as exemplified in FIG. 3a.

It would be highly desirable to provide some technique by which the alternating phase shifting processes can be applied in those instances where the opening configurations are overlapped, staggered or irregular. It is also desirable to limit conflicts in as many instances as possible. Accomplishing these features in general would improve the overall application of alternating phase shifting masks. It would also permit the application of more alternating phase shifting techniques to more complex masks.

SUMMARY OF THE INVENTION

The foregoing and other problems are overcome by an apparatus and technique in accordance with the invention for substantially eliminating spacing conflicts, in alternate phase shifting photolithography, between a first opening and two closely adjacent openings that are phase shifted with respect to each other. The technique involves using two exposures, one being carried out through a split mask wherein the first opening is divided into a plurality of split section openings or segments. The plurality of first segmented openings include at least one phase shifted opening and at least one non-phase shifted opening, and are each phase shifted with respect to one of the two closely adjacent openings at a location which is closely adjacent to that closely adjacent opening. The second exposure is carried out through a cover mask in which at least one cover section opening or segment is formed that defines at least those mask areas of the first opening that are not contained within the split section openings. Imaging radiation is projected through a plurality of the first segmented openings onto at least two first electromagnetic radiation application regions (EARs) on a surface to be imaged during one exposure. Radiation is projected through the second segmented opening in the cover mask onto one or more second electromagnetic radiation application regions on the surface during the other exposure. The mask configurations are such that the second EAR interconnects at least one of the phase shifted first EARs and one of the non-phase shifted first EARs. The mask apparatus may contain both the split mask and the cover mask on the same substrate.

BRIEF DESCRIPTION OF THE DRAWINGS

The above set forth and other features of the invention are made more apparent in the ensuing Detailed Description of the Invention when read in conjunction with the attached Drawings, wherein:

FIG. 4a illustrates another embodiment of a mask layout involving alternating phase shifting masks which results in conflicts (C) between adjacent phase shifted openings;

FIG. 4c illustrates one embodiment of a cover mask, which along with the split mask of FIG. 4b is capable of producing an entire photolithographic layout similar to that of the FIG. 4a mask without any conflicts;

FIG. 4d illustrates the mask layout created by superposition of the masks of FIG. 4b and 4c onto a surface;

DETAILED DESCRIPTION OF THE INVENTION

In this description, the terms "electromagnetic radiation" and "imaging radiation" are intended to cover all radiation which is transmitted via photons or electrons, including, but not limited to, visible, infrared, and ultra-violet radiation. Further, the term "closely adjacent" is used to indicate the spacing of juxta-posed mask openings which are spaced a distance that is close enough such that the intensity of the electromagnetic radiation applied to the unaffected space (e.g., 39 in FIG. 1) becomes relatively large compared with the intensity of the electromagnetic radiation applied to the EARs (as is the case in FIGS. 2c and 2d). This distance will typically be related to the resolution of the lithography tool used which is defined below in equation (1). In the present instance, the distance may be expressed as, $$\text{space} < \frac{.8\lambda}{NA}$$

where $\lambda$=exposure wavelength and

NA=numerical aperture of the tool

An "overlapping opening" is defined as one which is closely adjacent to two or more overlapped openings.

Figure 1:
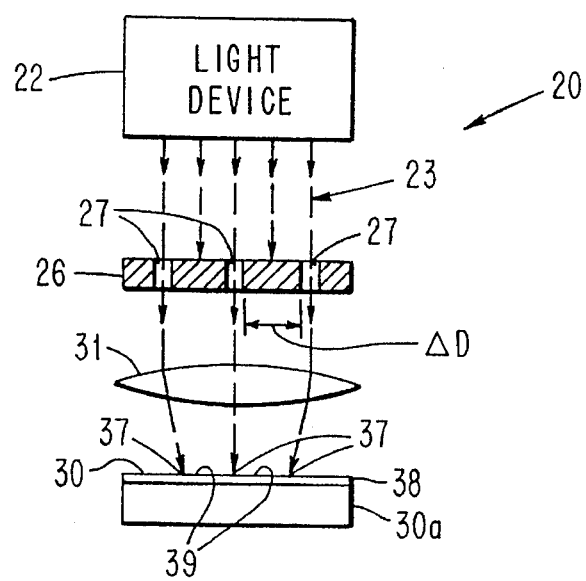
FIG. 1 is a cross-sectional illustration of one embodiment of a photolithography device, such as utilized by the present invention.
Figure 2A:
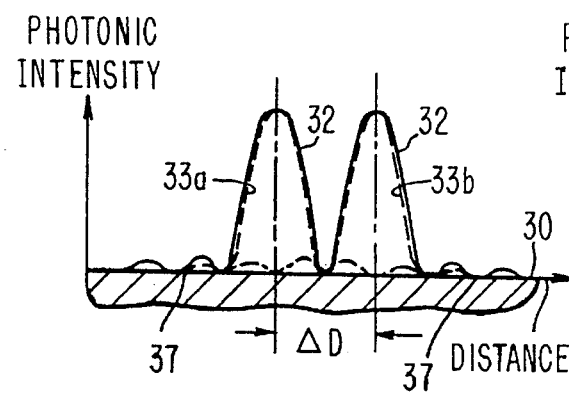
FIGS. 2a–2d illustrate an exemplary progression of plots of electromagnetic intensity when electromagnetic radiation is applied to a surface adjacent a mask formed with openings, as a distance ΔD between the openings becomes progressively smaller.
Figure 2B:
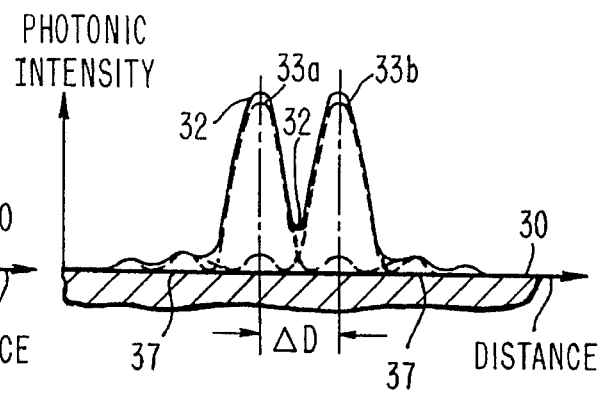
Figure 2C:
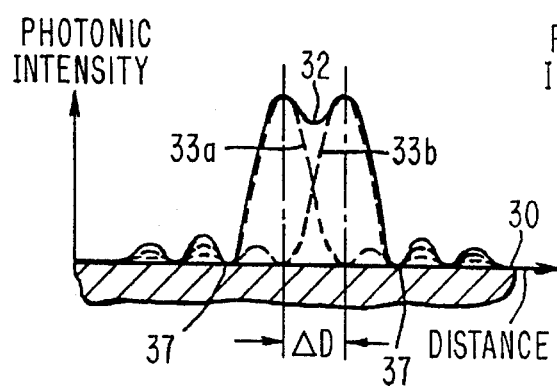

FIG. 1 illustrates a photolithographic device 20 for use with the present invention that includes a light source 22 which emits partially coherent electromagnetic radiation 23 (for example, ultraviolet light). This electromagnetic radiation 23 is applied to a mask 26. The mask has one or more openings 27 formed therein, and is configured to apply a desired pattern of electromagnetic radiation, via an appropriate optical system 31, to a surface 30 of a workpiece or wafer 30a. Photolithography has been found to be an especially suitable technology when applied to the patterning of semiconductor devices so that it will be understood that this description will be in that context. In photoresist processes, the surface 30 is coated with a positive or a negative photoresist 38. Suitable photoresists are known in the art, and will not be further detailed herein except as applicable to the present invention. The photoresist 38 is selectively patterned by the application of, or lack of application of, electromagnetic radiation.

The electromagnetic radiation strikes the surface 30 at a selected region called an electromagnetic radiation application region 37 (hereinafter referred to as "EAR"). EARs are defined as those regions of the surface 30 that have been exposed to sufficient electromagnetic radiation from the light source 22 to be affected by it. Any region on the surface which is not within an EAR is defined as an unaffected space 39. The unaffected spaces 39 typically correspond to chromed locations formed on the mask 26 which block the passage of electromagnetic radiation, however they may also be formed by using other known masking techniques. It is highly desirable to be able to decrease the minimum dimension of the EARs and the unaffected spaces. The application of electromagnetic radiation by masking techniques is often limited to very precise regions which affect (such as to cure) the characteristics of the photoresist; wherein other closely adjacent regions which are not exposed to electromagnetic radiation (the unaffected spaces 39) will not be similarly affected. Decreasing the minimum dimensions of the EARs and unaffected spaces corresponds to increasing the resolution of the photolithography source 20. The application of masks, EARs, unaffected regions, and light sources are generally known (but indicated by different names), and described in, for example, *Basic VLSI Design—Systems and Circuits—Second Edition*, by PUCKNELL and ESHRAGHIAN, Prentice Hall, 1988. The configuration of the masks 26, as well as the layout of the openings 27, are important features of the present invention.

Figure 2D:
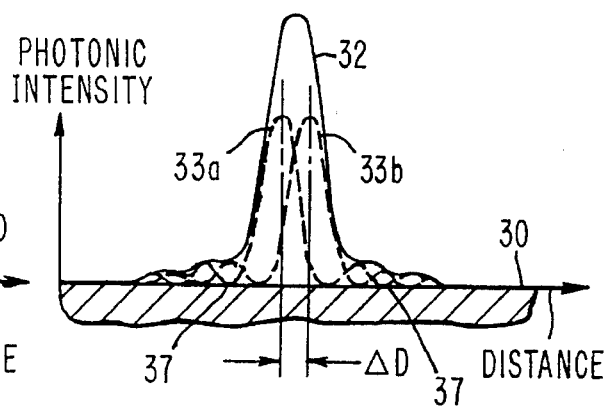

FIGS. 2a–2d illustrate the resultant intensities of electromagnetic radiation, which is applied evenly across a mask to the surface 30, after passing through two adjacent openings 27 formed in the mask 26 and located a distance $\Delta D$ apart. FIGS. 2a–2d, respectively show the successive intensity changes as the distance $\Delta D$ progressively decreases. The electromagnetic radiation is then applied to the surface. In FIGS. 2a–2d, the electromagnetic radiation intensities produced by each opening alone (as if the other adjacent opening was not present) are illustrated as broken lines 33a, 33b, while the intensity of the actual combined electromagnetic radiation of the two openings is illustrated as a solid line 32. As the distance $\Delta D$ between the openings becomes progressively smaller, as illustrated in FIGS. 2a to 2d, the combined electromagnetic intensity applied to the unaffected spaces increases due to the constructive interference of the radiation from each of the openings. The constructive interference results from electromagnetic radiation from both of the openings interacting due to diffraction of the electromagnetic radiation passing through the relatively small openings or slits. An extreme situation is illustrated in FIG. 2d, where the distance $\Delta D$ between the openings is so small that the constructive interference of the combined electromagnetic radiation 32 in the unaffected spaces 39 is of an intensity which is considerably higher than the intensity of the maximum electromagnetic radiation passing through either opening alone on any section of the surface 30. In the FIG. 2d case, any defined space between openings is completely eliminated in the resulting illuminated pattern appearing on the surface of interest and, as a result, any photoresist within the space will be affected. As can be appreciated, this is an undesirable situation.

The resolution of a photolithography tool follows the basic equation outlined in *Fundamentals of Optics*, Jenkins and White, McGraw Hill, N.Y. (1976). That is:

$$r = \frac{\kappa_1 \lambda}{NA}, \tag{1}$$

where $\lambda$ is a wavelength of the electromagnetic radiation used in the exposure, NA is a numerical aperture of the optical system 31, and $K_1$ is an Aries factor which relates to the limit of diffraction and which determines how aggressively the photolithography is being pushed ($K_1$ typically ranges between 0.7 and 0.9). The term "pushing" is defined as the resolution which is being attempted by the photolithographic process.

Another associated equation is:

$$DOF = \frac{K_2 \lambda}{(NA)^2}, \qquad (2)$$

where DOF is the depth of focus at a minimum resolution which indicates how far out of focus the exposure can be while still providing a resolution capable of resolving the minimum features. $K_2$ is a similar Aries factor to $K_1$, and also relates to how aggressively the photolithographic process is being pushed.

In order to enhance the resolution of the photolithography system, it is desired to minimize the value of r, which relates to the minimal thickness of the unaffected space 39 of FIG. 1. This may be accomplished by decreasing $\lambda_1$, decreasing $K_1$, or increasing NA. It is impractical to significantly increase NA (above 0.7) because in equation (2) the DOF decreases proportionately with the square of the NA. If the DOF is decreased too much, it becomes very difficult (and requires expensive equipment) to properly focus the photolithographic device 20. The most promising technique to decrease r in equation (1), while still maintaining a useful system as per equation (2), is to decrease $K_1$. One technique which permits this reduction of $K_1$ involves phase shifting masks as described in the above-cited Levenson article.

Phase shifting masks may be categorized into one of several types for use with various types of photolithography techniques including alternating phase shifting (Alt), such as the Levenson system, attenuated (Att) and unattenuated (Utt) phase shifting, sub-resolution phase shifting (outrigger type), rim (Rim), and chromeless (phase edge). All of these types or classes of photolithography techniques are generally known in the art, and will not be greatly detailed herein.

Phase shifting is accomplished by at least one of many techniques, each of which technique involves retarding electromagnetic radiation passing through one opening compared to electromagnetic radiation passing through another opening. Since electromagnetic radiation propagates through air faster than mediums such as glass, phase shifting can be accomplished by providing different thicknesses of glass in each phase shifted opening. This variation in thickness can be accomplished by etching glass material away, or by adding an additional layer of $SiO_2$ or other glass-like material, onto the mask. This variation of thickness is precisely selected to shift the desired amount of electromagnetic radiation passing through the phase shifted openings compared to non-phase shifted openings. Alternately, the transmission medium adjacent the phase shifted openings compared to the non-phase shifted openings can be selected with different propagation rates, which will alter the transmission rates by a selected amount (using glass, plastic, or some other medium with different propagation rates). While glass is described as being the material which the mask is partially formed from, it is possible to use any suitable transmission material in its place.

Alternating phase shifting masks are those in which the electromagnetic radiation which passes through at least one opening is phase shifted (usually by 180 degrees) with respect to the electromagnetic radiation which passes through any closely adjacent opening. In this description, the term "closely adjacent" indicates the situation where adjacent mask openings are spaced a distance which is close enough such that the intensity of the electromagnetic radiation applied to the unaffected space becomes relatively large compared with the intensity of the electromagnetic radiation applied to the EARs.

The alternating phase shifting rule is followed in any direction that is substantially parallel to the surface 30, (which typically is in the form of a plane). Therefore, the electromagnetic radiation which passes through adjacent openings tends to destructively interfere when the mask is configured using alternating phase shifting principles.

The alternating phase shifting mask (as described in the Levenson article) is capable of significantly improving the resolution of closely positioned openings which are uniformly spaced apart. With the support of a reflection-managed photoresist system, it is possible to attain a resolution of 0.35 $\lambda$/NA. This equates to a 0.18 µm resolution with $\lambda$=248 nm and NA=0.5. The present invention improves upon the alternating phase shifting technique, by employing multiple masks to limit conflicts of electromagnetic radiation passing through adjacent openings.

FIGS. 3a, 3b, 4b–4d, 5b–5d, and 8b illustrate masks with selected phase shifting openings (indicated with cross-hatching or dark areas) compared to non-phase shifting openings (without cross-hatching). All electromagnetic radiation which passes through each phase shifted opening has substantially the same phase. All electromagnetic radiation that passes through each of the non-phase shifted openings has substantially the same phase. Selection of which openings are phase shifted, compared to which are non-phase shifted, is arbitrary and may be reversed.

Split and Cover (SAC) Techniques

Figure 6:
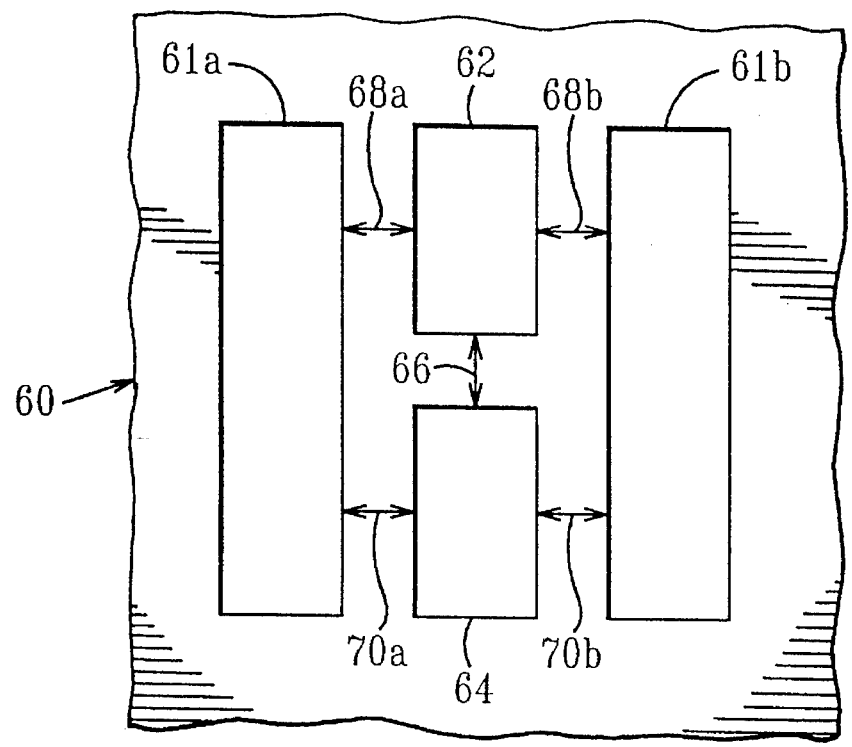
FIG. 6 is a mask layout which indicates a relatively common overlapping/overlapped situation in which it is desirable to apply the SAC techniques.

Another class of techniques are the split and cover (SAC) techniques. FIG. 6 illustrates a mask layout embodiment in which it is desirable to use the SAC techniques. In a mask 60, as shown in FIG. 6, two longitudinally disposed overlapped openings 62, 64 are sufficiently close to each other to produce a conflict 66. In this disclosure, an overlapping opening is defined as one which is closely adjacent to two or more overlapped openings. Each of the overlapped openings 62, 64 is spaced closely adjacent to a pair of overlapping openings 61a, 61b so as to produce respective conflicts 68a, 70a, 68b, 70b. While any two of the above openings 61a, 61b, 62, 64 could be alternately phase shifted to avoid conflicts; the FIG. 6 configuration (in which the pair of overlapped openings 62, 64 is surrounded by the pair of overlapping openings 61a, 61b on opposed sides) makes it geometrically impossible to alternate each adjacent pair of openings. Under these conditions, the SAC technique should be applied to limit conflicts in each overlapping opening in a manner described below.

Figure 7:
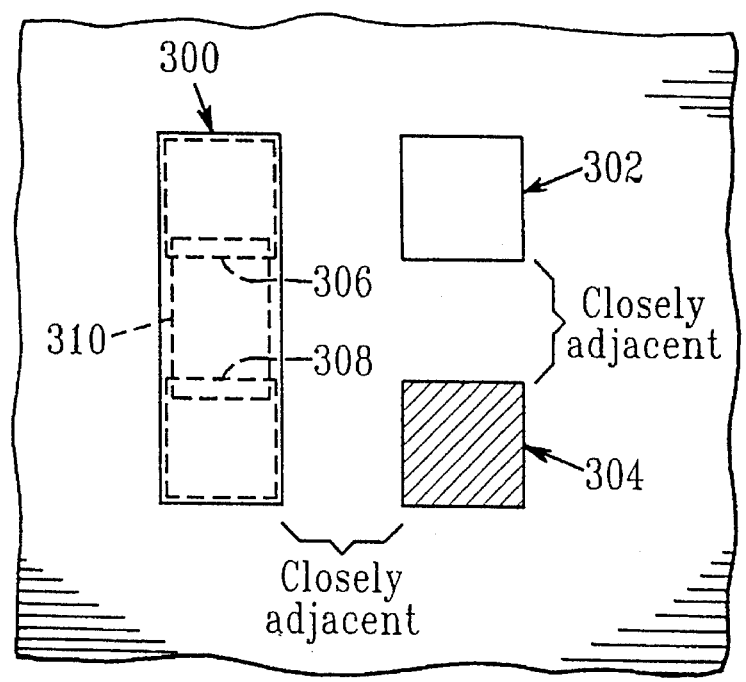
FIG. 7 illustrates a set of mask openings and indicates the use of a split mask and a cover mask in accordance with the SAC techniques.

FIG. 7 illustrates the general mask layout in which it is desired to use the SAC technique. Any time that a first opening 300 of a mask is closely adjacent to any other two adjacent openings 302, 304, wherein each of the two adjacent openings 302, 304 are phase shifted with respect to each other, then it is impossible to alternate the first opening with each closely adjacent pair of openings. Under these circumstances, the SAC technique should be used. The SAC technique involves dividing the first opening 300 into a plurality of segments 306, 308 (illustrated in broken lines) such that each segment is of the opposite phase as one of the adjacent openings (302, 304) at each location that there is a potential conflict. This dividing of the first opening 300 into a plurality of segments is referred to herein as "splitting" the opening and is accomplished by using a split mask containing the segments as openings (306,308). The SAC technique further includes providing a covering or cover mask, with an opening 310 shown in broken lines, which "covers" all of the area (solid lines) covered by the first mask which is not covered by the openings 306 and 308 in the split mask.

FIGS. 3a–3d demonstrate another situation where the SAC technique is applicable. The conflicts are caused by a pair of overlapping openings 34a and 34b both overlapping a plurality of longitudinally spaced, closely adjacent overlapped openings 34c, 34d, 34e, and 34f. Regardless of whether any adjacent pair of overlapped phase shifted openings 34c, 34d, 34e, and 34f is selected as phase shifted (cross-hatched) or non-phase shifted (clear) openings, the overlapped openings 34c, 34d, 34e and 34f will conflict with either or both of the overlapping openings 34a, 34b. Since there are a plurality of overlapped openings 34c, 34d, 34e, 34f which are closely adjacent to each other, the overlapped openings must each be alternately phase shifted with respect to its neighbor(s) to limit conflicts produced therebetween. Due to the alternating configuration, there are conflicts produced between the overlapping and certain of the overlapped openings. The conflicts illustrated in the alternating mask layout of FIG. 3a can be circumvented by the technique using the mask layouts of the FIGS. 3b–3d embodiment of the present invention.

Figure 3A:
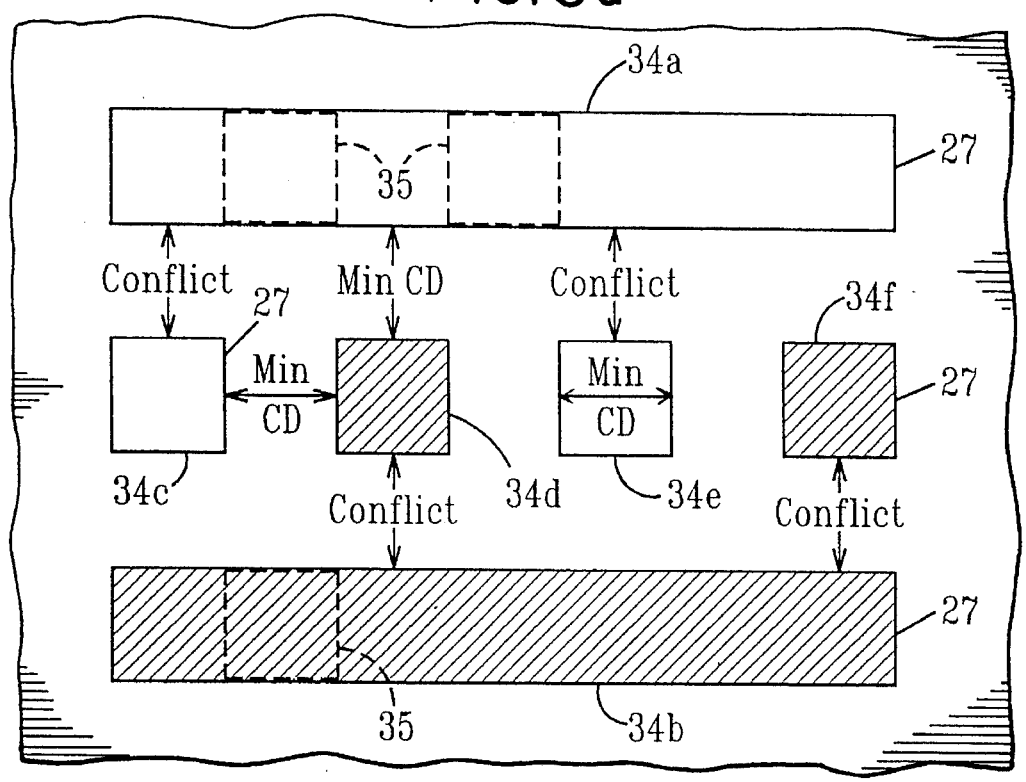
FIG. 3a illustrates a standard alternating phase shifting mask layout having associated conflicts indicated between adjacent or juxta-posed openings.
Figure 3B:
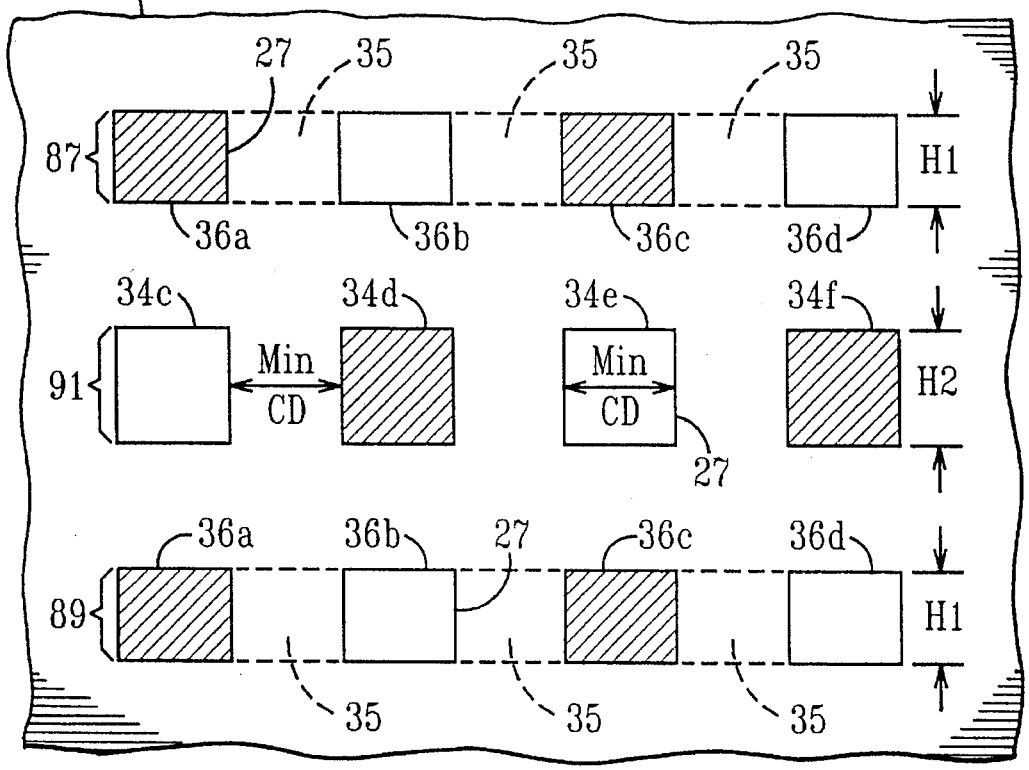
FIG. 3b illustrates one embodiment of a split mask layout which is used to partially produce the FIG. 3a layout in such a manner as to limit the conflicts.
Figure 3C:
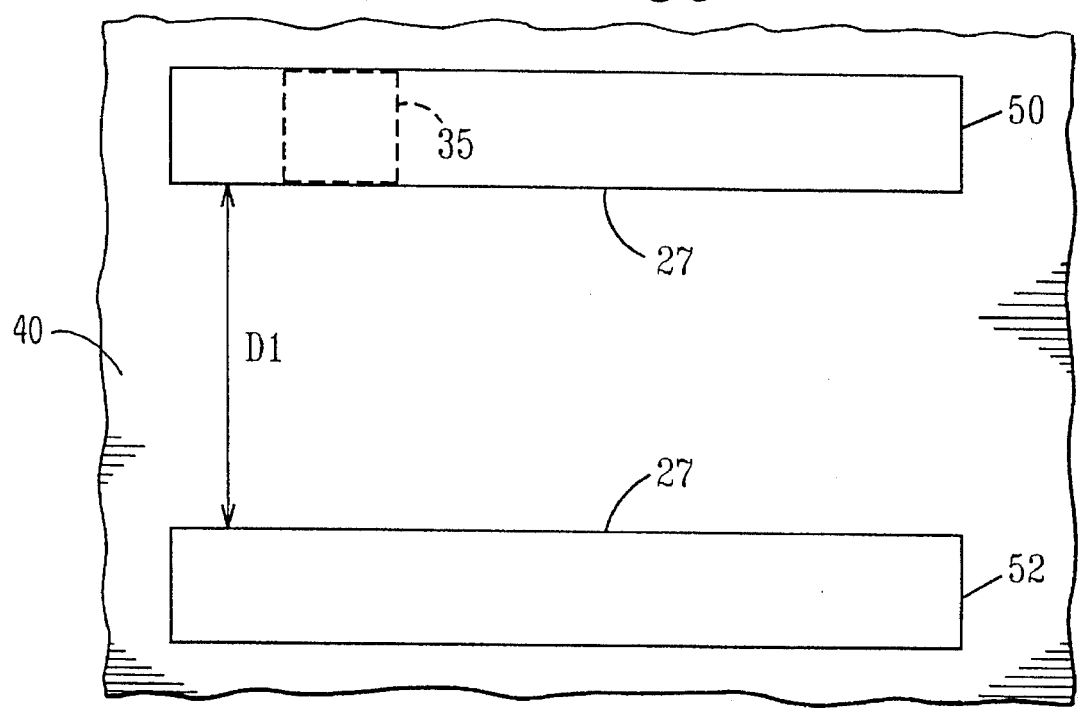
FIG. 3c illustrates one embodiment of a cover mask, which when exposed with the split mask of FIG. 3b produces a layout similar to that illustrated in FIG. 3a without any of the conflicts.
Figure 3D:
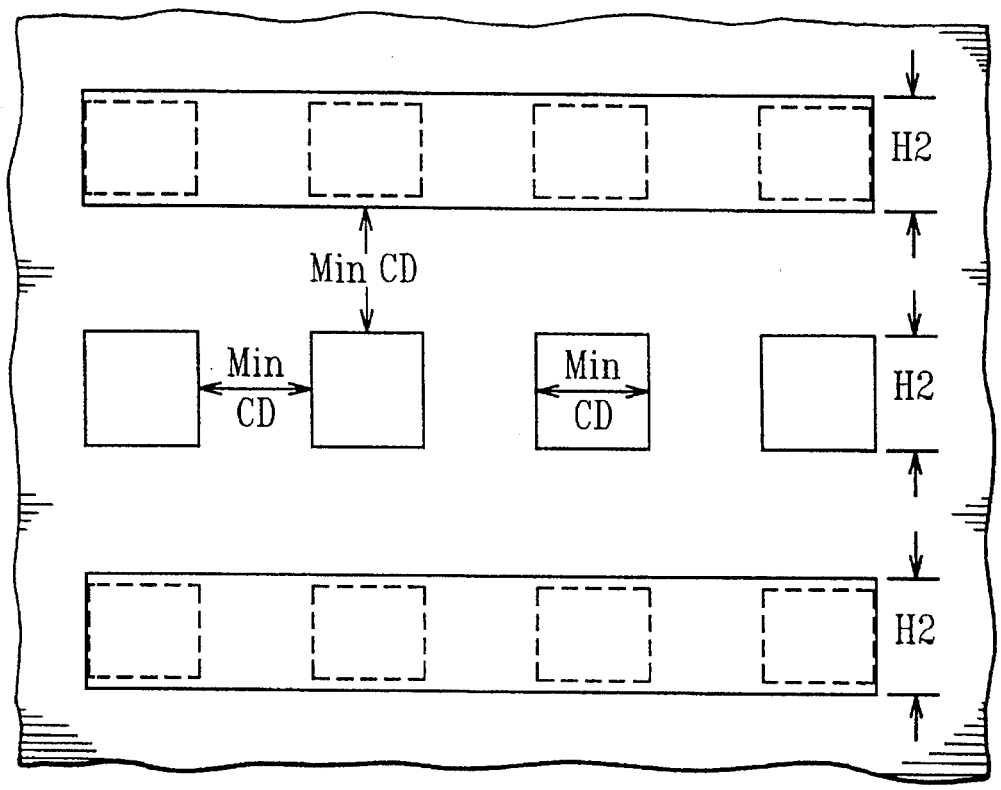
FIG. 3d shows the resultant image created by superposition of the masks of FIG. 3b and 3c onto a surface, illustrating the respective sizes of the openings in the FIGS. 3b and 3c masks.

The split and cover technique (SAC) illustrated in FIGS. 3b–3d utilizes a pair of masks. The first mask which is illustrated in FIG. 3b is referred to herein as a split mask 49, and the second mask which is illustrated in FIG. 3c is referred to as a cover mask 40. Both the split mask 49 and the cover mask 40 are superimposed sequentially as distinct exposures of the photoresist. The split mask 49, whose exposure may be applied to the surface 30 (FIG. 1) before or after the cover mask 40, is configured such that the electromagnetic radiation which passes though each opening is alternately phase shifted (usually by 180 degrees using one of the above-described techniques) with respect to the electromagnetic radiation which passes through each closely adjacent opening. In this manner, conflicts which occur in the mask of FIG. 3a are eliminated by using, in combination, the split mask of FIG. 3b and the cover mask of FIG. 3c.

In the split mask 49, the overlapping openings 34a, 34b of FIG. 3a are each divided into split section openings 36a, 36b, 36c, 36d which are positioned as to not overlap any two adjacent overlapped openings 34c, 34d, 34e, 34f. This permits the split section openings 36a–36d to be phase shifted with respect to their neighbors in such a manner as to provide a two dimensional alternating phase shifting configuration. Broken line regions 35 of the mask which are covered by overlapping openings 34a, 34b, are not covered by the split section openings 36a–36d. Dividing the overlapping openings 34a, 34b of FIG. 3a into alternating openings 36a–36d, and broken line areas 35, permits a two-dimensional alternating phase array in the split mask of FIG. 3b. This two dimensional alternating phase array limits the occurrences of the conflicts illustrated in FIG. 3a.

The cover mask 40 of FIG. 3c is then provided with openings 50 and 52 which cover all the opening areas of the mask of FIG. 3a which are not included in the mask of FIG. 3b, i.e., substantially openings 34c–34f and regions 35. For example, broken line regions 35 in openings 34a and 34b in FIG. 3a are not exposed by the split mask 49 in FIG. 3b; but are exposed as portions of the openings 50 and 52 of cover mask 40 in FIG. 3c. Since the broken line regions 35 are not exposed in FIG. 3b, the adjacent regions therein which are exposed at the same time, e.g., 36a and 36b, are alternately phase shifted with respect to each other.

Therefore, in forming the original conflicting overlapping openings 34a, 34b of FIG. 3a in SAC applications, the original overlapping openings 34a, 34b are broken down into section openings in the split mask 49 and the cover mask 40. The split mask section openings 36a, 36b, 36c and 36d provide alternating mask configurations which do not conflict with the overlapped openings (34c, 34d, 34e, 34f of FIG. 3a) in the original layout. The section openings 50, 52 of the cover mask 40 expose those areas of the original layout which are not exposed during the split mask exposure. This division of certain overlapping openings 34a, 34b, as illustrated in FIG. 3a, into alternating phase shifted split section openings 36a–36d, of FIG. 3b, and the cover section openings 50, 52 of FIG. 3c permits the application of alternating phase shifting principles to layouts having one or more overlapped openings which are overlapped by two parallel overlapping openings.

The cover mask 40 of FIG. 3c is configured such that none of the openings 50, 52 are sufficiently close to each other to provide a conflict on the cover mask 40. Actually, the section openings 50, 52 of the cover mask 40 of FIG. 3c are sufficiently spaced so that phase shifting techniques are not required, since a distance D1 between the adjacent section openings 50, 52 is preferably selected to be large enough to limit constructive interference between the electromagnetic radiation passing through the adjacent openings. Therefore, the possibility of substantial constructive interference occurring between the electromagnetic radiation passing through each of the adjacent openings 50, 52 is eliminated. If distance D1 is of a dimension that conflicts occur between section openings 50, 52, then the section openings are alternately phase shifted with respect to each other.

There may be some overlap between certain of the section openings of the split mask 49 (for example, 36a, 36b in an upper row 87 and a lower row 89 of the split mask 49 of FIG. 3b), and certain of the section openings (50 and 52, for example) of the cover mask 40 of FIG. 3c. The term "overlap" indicates in the present context the occurrence of an opening on a split mask being co-positioned with the location of an opening on a cover mask. As electromagnetic radiation is applied to a specific EAR on a photoresist covered surface for an extended period, a phenomenon referred to as "blooming" occurs in which the dimension of the area affected (i.e., caused to harden or be left unhardened by the application of the electromagnetic radiation to photoresist) increases beyond where the electromagnetic radiation is actually applied. Therefore, if electromagnetic radiation is applied to the same EARs through successive cover masks and split masks, the dimension of the EAR may actually increase.

In order to overcome this blooming phenomenon, either the split mask 49 or the cover mask 40 is produced with section openings of smaller than the desired final dimension. For example, if the desired final dimension is H2, then in FIG. 3b a dimension H2 for the section openings 36a–36d in rows 87 and 89 of mask 49, since they overlap the openings 50, 52 of mask 40 in FIG. 3c, may produce a final dimension greater than H2. Consequently, the openings 36a–36d of the upper and lower rows 87, 89 are formed with a dimension H1 which is less than desired final dimension H2. However, the dimension for the openings 34c–34f that produce non-overlapping shapes (which in the FIG. 3b embodiment are the openings in the middle row 91) are of the desired final dimension H2 as illustrated in FIG. 3d.

While the anti-blooming opening configurations just mentioned are applied such that the dimensions of openings in the split mask 49 are reduced, it is also within the scope of the present invention that the dimensions of the overlapping openings of the cover mask 40 be reduced. However, in the FIGS. 3a–3d embodiment, it is preferred to reduce the dimensions of certain of the openings in the split mask since the cover mask (FIG. 3c) is formed with the cover section openings 50, 52 which include broken line regions 35. These broken line regions 35 are not included as openings in the split section openings 36a–36d of FIG. 3b.

Figure 4B:
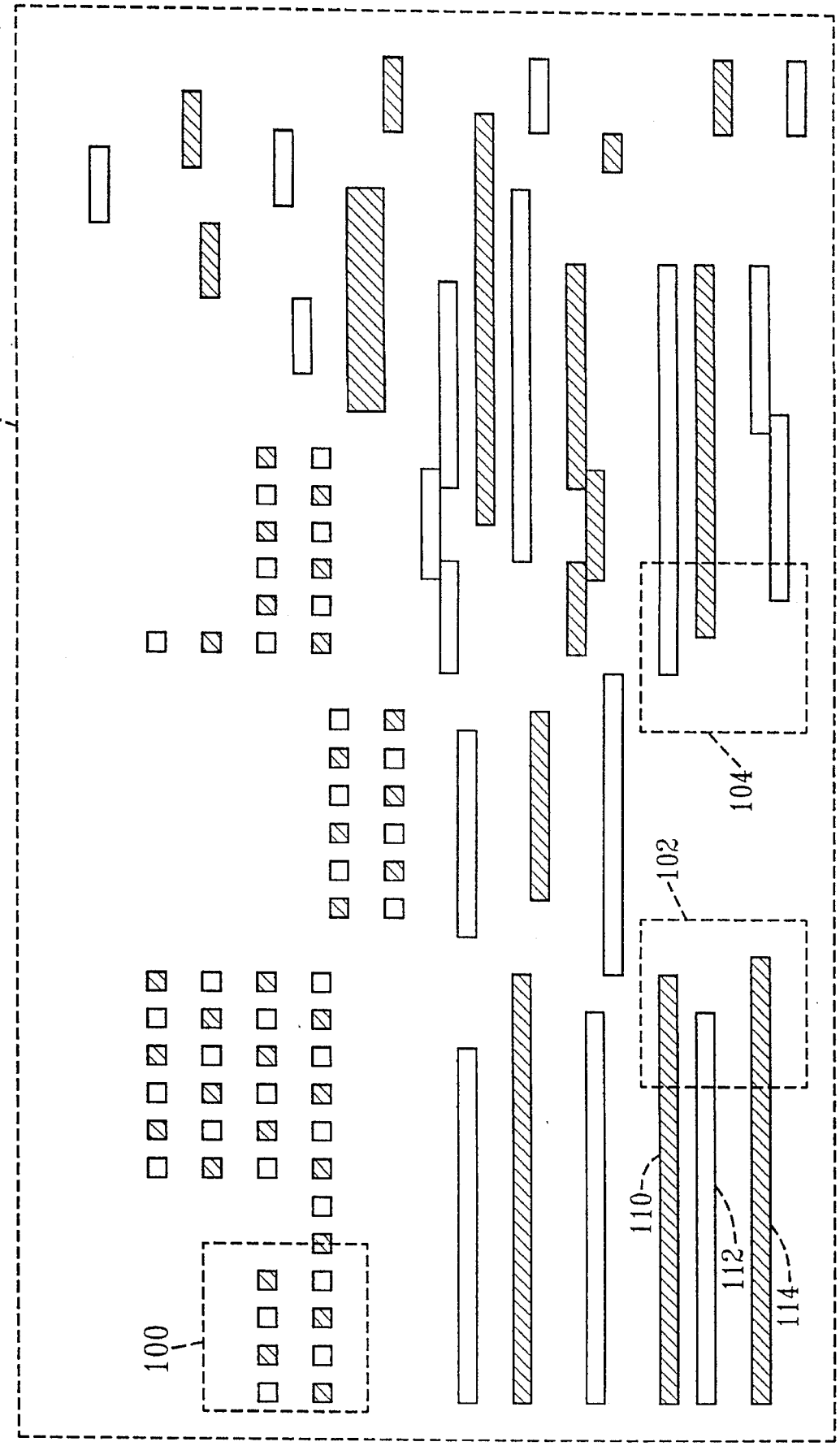
FIG. 4b illustrates one embodiment of a split mask layout which produces a portion of the same photolithographic pattern as the FIG. 4a mask without any conflicts.

SAC techniques can be combined with other photolithographic techniques as illustrated in FIGS. 4a–4d and 5a–5d. The techniques of SAC can be combined with those, for example, of OSEP (which is described above in the Background). FIG. 4a illustrates a mask layout which has multiple conflicts (C), when using non-SAC alternating phase shifting techniques. One of these conflicts, as illustrated by the openings within the dashed portion 100, results from the overlap on both sides of a plurality of axially extending overlapped members 34c–34f by two longer, overlapping members 34a, 34b similar to the configuration of FIG. 3a.

The use of the cover mask 63 (FIG. 4c) and the split masks 61 (FIG. 4b) which are exposed sequentially as described above, remedies the type of conflict illustrated where one opening is positioned closely adjacent to a plurality of openings which are phase shifted with respect to each other (as occurs in the FIG. 4a overlapping-overlapped configuration). This conflict is eliminated in a similar manner to that previously described with reference to FIGS. 3b–3d. The reference characters 34a–34f that are included in the dashed region 100 of FIG. 4a indicate openings that are substantially identical to those included in FIG. 3a to demonstrate the corresponding openings which provide a conflict.

Conflicts, which may be solved by techniques other than SAC, may exist when a layout becomes extremely complex. One example of such a conflict exists where many openings are parallel to an X axis while other openings are parallel to a Y axis (the X and the Y axes are oriented as illustrated in FIG. 4a). Such a conflict exists within dashed regions 102 and 104. Also, multiple openings which extend in the same direction may simply be spaced too close to each other, and may therefore form a conflict as illustrated in dashed region 104. Two masks (wherein a portion of the first mask is used as a split mask in the SAC technique, while a portion of the second mask is used as a cover mask in the SAC technique) may also be used to separate those openings that are oriented in generally different directions such as illustrated in region 102, or that are spaced too close to each other such as illustrated in region 104. FIG. 4b illustrates a split mask 61 which is to be exposed at a different time than a cover mask 63, illustrated in FIG. 4c.

The technique of using the split mask 61 and the cover mask 63 not only provides the capabilities of using the SAC technique, but it also provides two masks in which portions of the mask layout which are not being utilized for the SAC technique, and which do not conflict with section openings of the SAC technique, can be provided with two sets of conflicting openings that can be exposed at different times. This configuration limits other non-SAC types of conflicts. For example, the dashed region 102 in FIG. 4a contains a plurality of openings which are parallel to the X axis, i.e., 110, 112, 114; while there is one opening 116 which extends parallel to the Y axis. The opening 116 is closely adjacent to all three openings 110, 112, 114. Therefore, if the opening 116 is exposed at the same time as the openings 110, 112, 114, there will likely be adverse constructive interference between the electromagnetic radiation passing through the opening 116 and the electromagnetic radiation passing through the other three openings 110, 112, and 114. Consequently, the three openings 110, 112, 114 which are parallel to the X axis are exposed in the first (the split) mask 61, while the opening 116 which is parallel to the Y axis is formed in a second (the cover) mask 63. Conversely, openings 110, 112, and 114 could be formed on the cover mask and the opening 116 formed on the split mask. In this manner, OSEP technology can be applied to SAC masks in regions which are not close to the regions where SAC conflicts occur, as illustrated in broken area 100. The distinction between the split mask and the cover mask, which is significant in the SAC technique, loses its significance when a disassociated segment of each mask is applied to another masking technique, such as to OSEP or other non-SEP technology.

The openings being spaced closely adjacent to each other, in itself, is not a sufficient reason to form the openings on different masks. For example, opening 112 is closely adjacent to both the openings 110 and 114. However, alternate phase shifting by itself is sufficient to eliminate any potential conflict between the opening 112 and each of the other two openings 110, 114.

It is desirable to limit mask layouts in which a plurality of openings, formed in the same mask, are actually contacting, as is the case in bracketed region 104 between opening 120 and both openings 122 and 124. It is possible that excessive electromagnetic radiation will be applied to the surface shown in FIG. 1 via the combined opening. It therefore may be desirable to divide up the OSEP contacting openings into two masks. That is, not only is the present invention pertinent to combining OSEP and SAC technology on the split mask and the cover mask as described above, it is also pertinent to combining OSEP/SAC technology with whatever other mask technology would benefit from dividing the required mask openings between two, or more, masks.

Figure 5A:
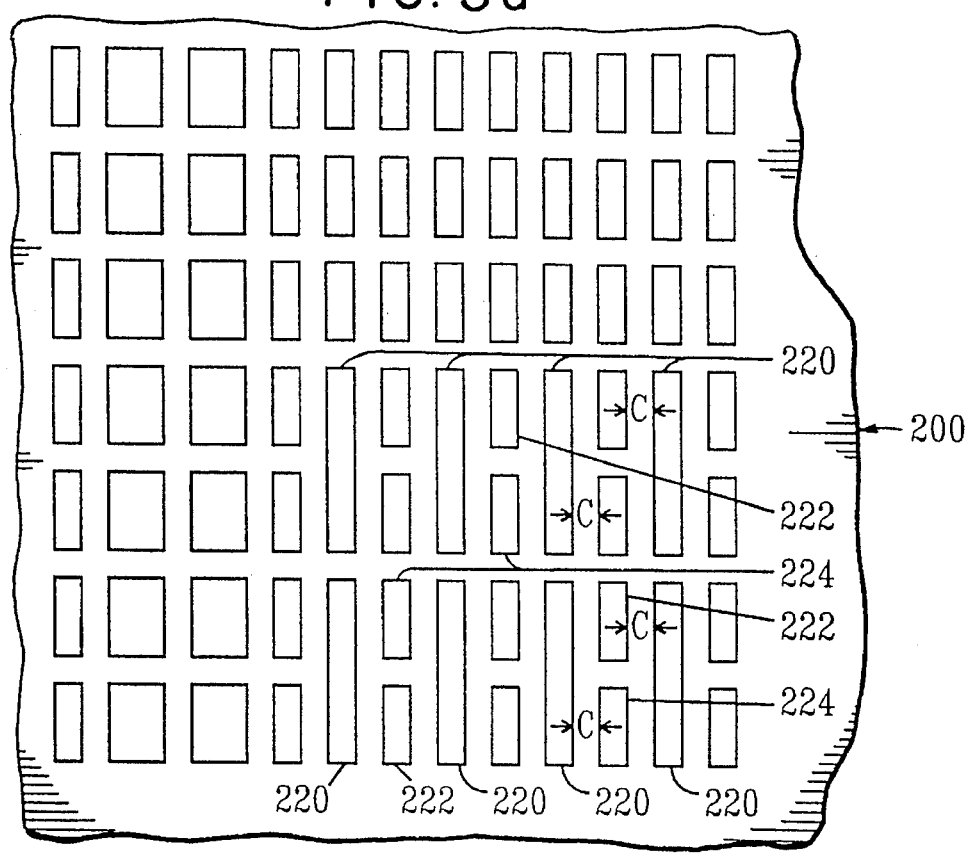
FIG. 5a shows a further embodiment of a mask layout which, if produced by standard alternating phase shifting masks, results in conflicts between adjacent openings as illustrated.
Figure 5B:
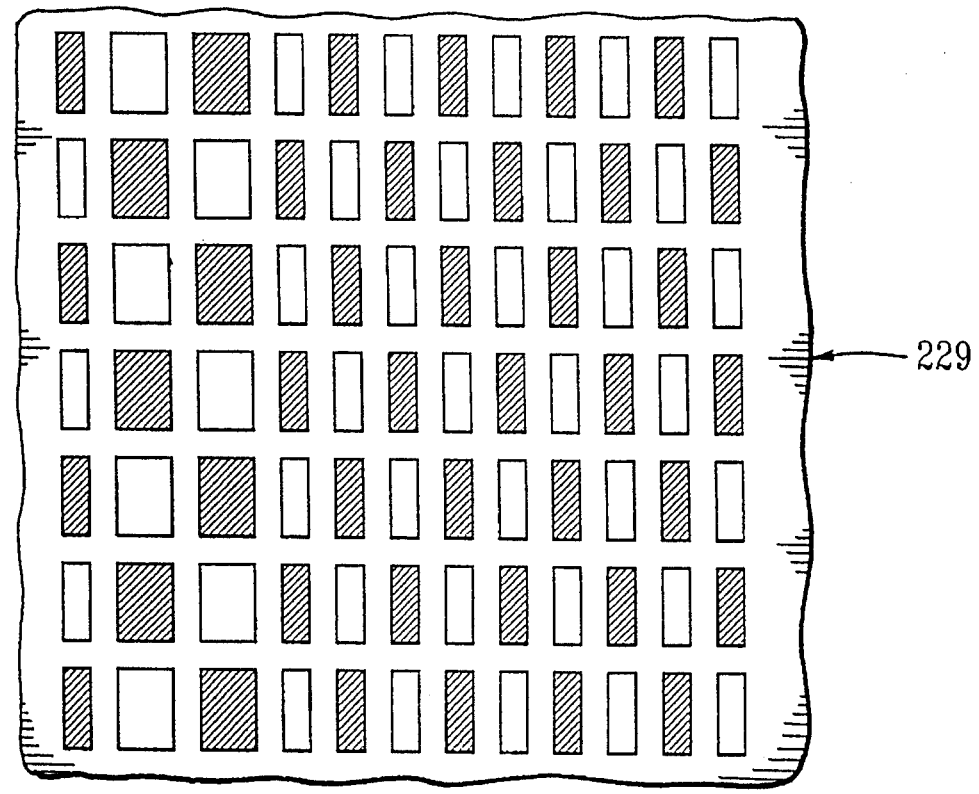
FIG. 5b illustrates one embodiment of a split mask layout which produces a portion of the same photolithographic pattern as the FIG. 5a mask without any conflicts.
Figure 5C:
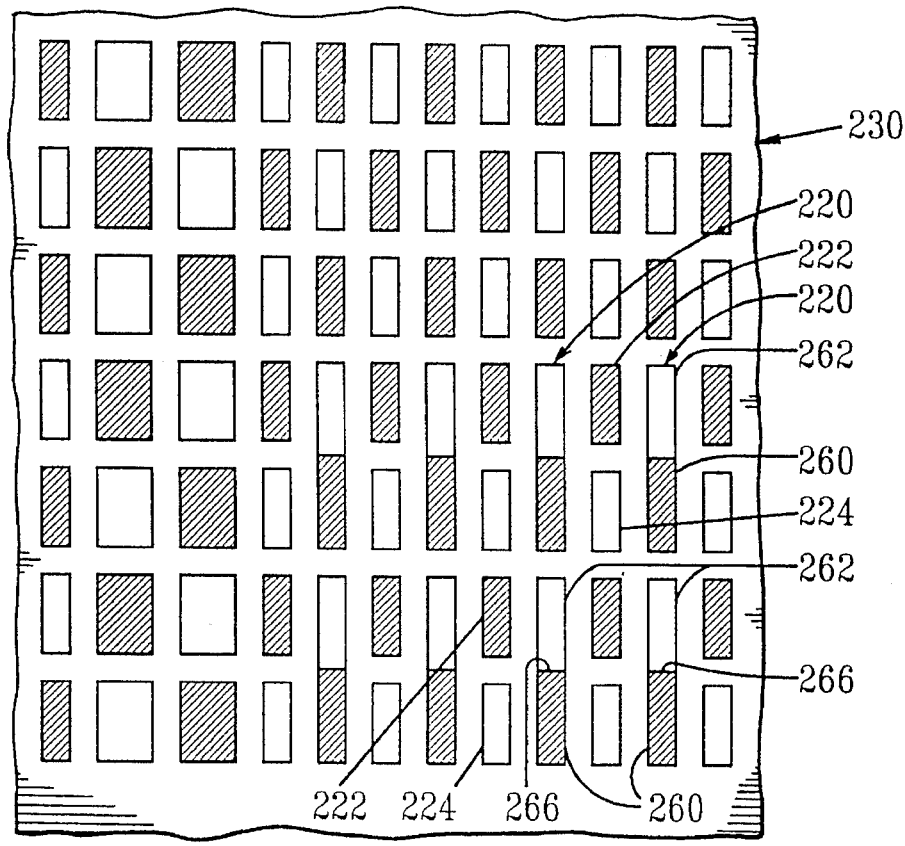
FIG. 5c is an alternate embodiment of a split mask which, like the mask of FIG. 5b, is capable of producing a portion of the layout pattern illustrated in FIG. 5a without conflicts.
Figure 5D:
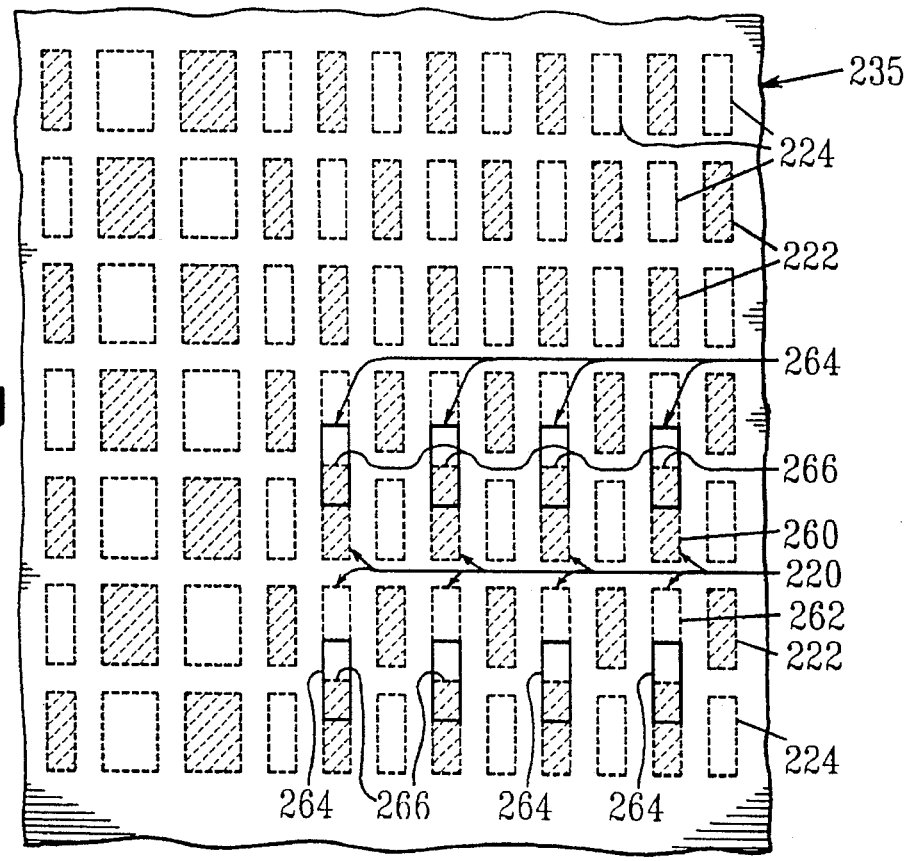
FIG. 5d illustrates one embodiment of a cover mask, which along with the split mask of FIG. 5c is capable of producing an entire photolithographic layout similar to that of the FIG. 5a mask without any conflicts.

FIGS. 5a–5d illustrate the application of SAC technology to another layout. FIG. 5a illustrates an exemplary mask 200 layout which is used in photolithography processes to produce a storage node (capacitor). The FIG. 5a layout has a plurality of occurrences where two extended openings 220 bracket or surround a pair of smaller openings 222, 224. This configuration between the overlapping extended openings 220 and the overlapped openings 222, 224 presents a situation that can benefit from the SAC technique of this invention. To remedy the conflicts C illustrated in FIG. 5a, one solution is to form a split mask 230 and a cover mask 235 as illustrated in FIGS. 5c and 5d, respectively. The split mask 230 and the cover mask 235 are utilized with SAC techniques substantially identical to that previously described with regard to FIGS. 3b and 3c, respectively, and will be further described below.

Figure 8A:
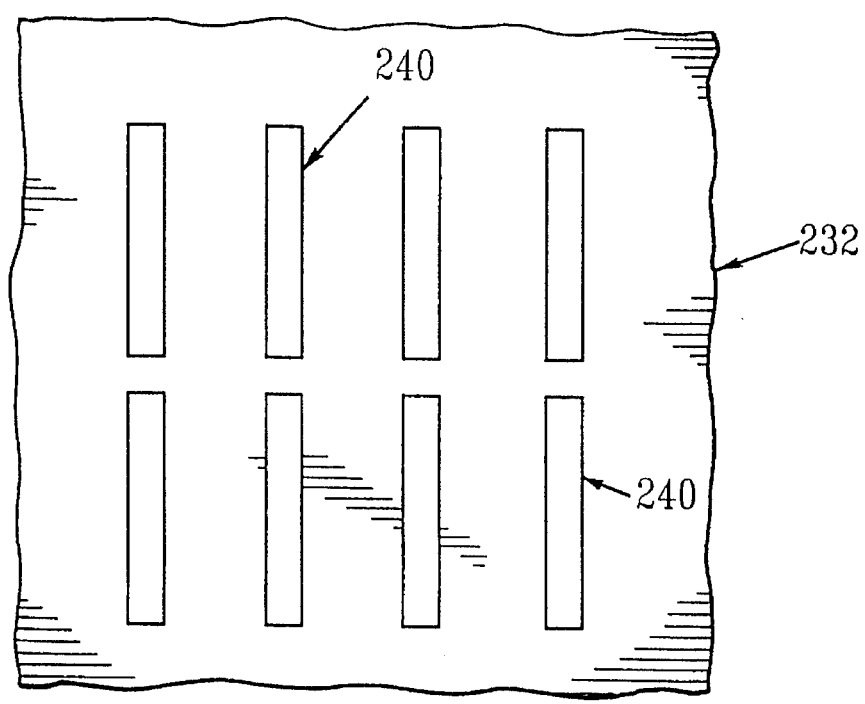
FIG. 8a illustrates one embodiment of a cover mask in accordance with the SAC techniques which, along with the split mask of FIG. 5b, is able to produce a layout similar to that illustrated in FIG. 5a without any conflicts.
Figure 8B:
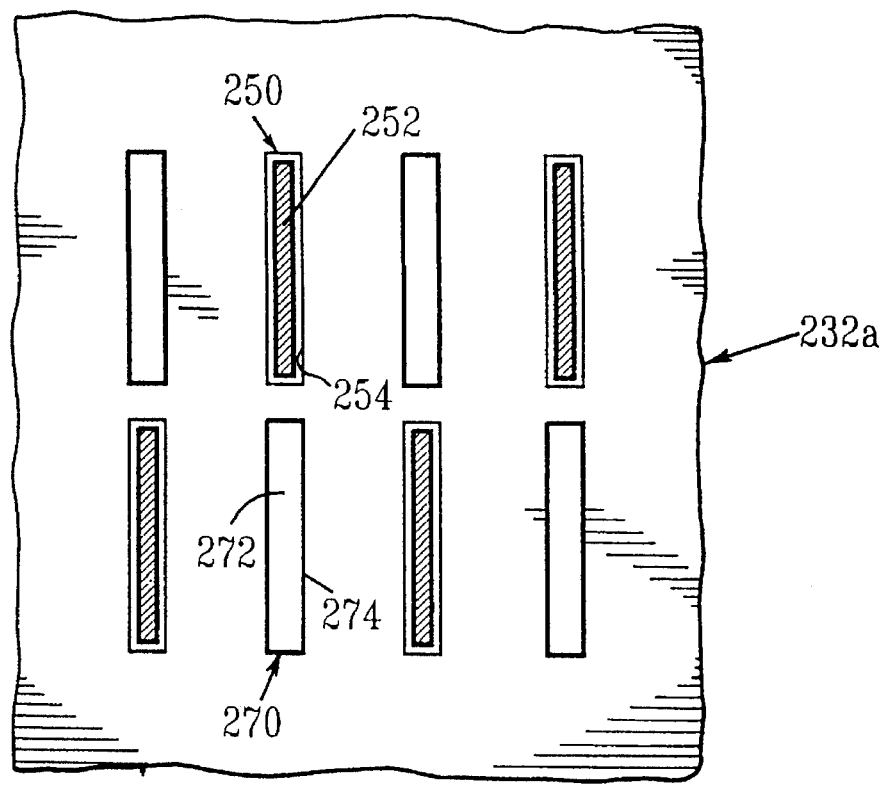
FIG. 8b is an alternate embodiment of the cover mask of FIG. 8a, and is known as an Alt-Rim mask, which is capable of producing a similar layout when used in conjunction with the FIG. 5b split mask.

Another solution, in addition to applying SAC techniques as indicated with the masks of FIGS. 5c and 5d, is the use of the split mask 229 in FIG. 5b together with the cover mask 232 shown in FIG. 8a. In this regard, FIG. 8a illustrates one embodiment of a cover mask, in accordance with the SAC technique, that cooperates with phase shifted and non-phase shifted openings (dark and light areas, respectively) in the split mask 229. The openings 240 in cover mask 232, along with those in the split mask 229 of FIG. 5b, are able to produce a layout similar to that illustrated in FIG. 5a without any conflicts. Additionally, it is possible to use Alt-Rim technology for cover mask 232 as will be seen with reference to FIG. 8b. FIG. 8b is an alternate embodiment of the cover mask of FIG. 8a, known as an Alt-Rim mask 232a, which is capable of producing a similar layout when used in conjunction with the FIG. 5b mask. As shown in FIG. 8b, a first type of Alt-Rim opening 250 has an interior portion 252 formed from a phase shifting material, and a rim portion 254 formed from a non-phase shifting material. A second type of Alt-Rim opening 270 has an interior portion 272 formed from a non-phase shifting material, and a rim portion 274 formed from a phase shifting material. The first type of opening 250 and the second type of opening 270 are alternated along two orthogonal axes in a similar manner to the standard alternating phase shifting technique. Alt-Rim technology is differentiated from rim technology in that rim technology is applied to openings that are isolated from other openings such that conflicts are not a problem. Alt-Rim technology combines rim technology with alternating phase shifting such that the corresponding portions (rim portion and center portion) of each pair of closely adjacent openings is reversed. The alternating rim technology illustrated in FIG. 8b can provide enhanced resolution under certain conditions as compared to the standard opening technology illustrated in FIG. 8a in circumstances where the openings are spaced very close to each other.

Returning to split mask 230 of FIG. 5c, it will be seen that in contrast to the split mask 229 of FIG. 5b, mask 230 has segments of the extended openings 260 (dark areas), which are phase shifted and connected with the segments of the extended openings 262 (light areas) which are not phase shifted. All section openings 264 on the cooperating cover mask 235 of FIG. 5d (illustrated in solid outlines) now only cover up to an opaque line 266 formed between the phase shifted openings 260 and the non-phase shifted opening 262. Such technology is referred to as alternating and attenuating (Alt-Att). Alt-Rim and Alt-Att, as well as their combination with unattenuating, i.e., Alt-Rim-Utt and Alt-Att-Utt, are examples of hybrid technology which may be used in association with SAC technology to enhance the SAC technology, as well as SAC resolution under certain circumstances.

In FIG. 5d, the openings 220, 222, 224, 260, 262 of the split mask 230 of FIG. 5c are illustrated in broken lines superimposed with solid openings 264 which are formed in the cover mask 235. The openings 264 formed in the cover mask of FIG. 5d extend only a short distance over each edge of the opaque line 266 formed between openings 260 and 262. This illustrates, in general, that the covering mask is only required to cover any actual area between openings formed in the split mask and not cover the openings themselves.

Superposition of the exposures of the cover mask and the split mask in the SAC technique must be performed carefully to ensure that the mask openings are properly aligned. In other words, it is essential that all desired opening locations of the split mask correspond to appropriate opening locations on the cover mask. This precision can be enhanced as will now be described.

When the field of the imaging or optical system 31 in FIG. 1 is sufficiently large, the cover mask and the split mask can be fabricated from a single substrate and share the entire optical field. Exposures of the workpiece or wafer surface 30 are stepped at half field intervals wherein the split mask and cover masks are exposed at the same time for different EARs. Then the stage (not illustrated) which secures the wafer is stepped to a position such that the portion of an EAR, which at least one of the split and cover masks is exposing, is at the same location as the EAR of the other mask during the prior exposure. The split and cover masks are then exposed again. This process of sequentially exposing split and cover masks across the substrate surface is continued until each portion of the wafer surface 30 corresponding to an EAR is exposed by both the split mask and the cover mask. This technique makes overlay accuracy dependant on stage procession precision (which is presently in the order of 30 to 100 nm). The technique can be applied in two dimensions across the field of view of the optical system and is desirable since EARs are generally becoming relatively larger compared to the dimension of the surface which is being exposed.

Alternatively, with two separate masks (a split mask and a cover mask), the second exposure can be performed after the entire wafer is stepped, but before the wafer is removed from its chuck. Hence, the overlay accuracy of the superposition is again related to the stage procession precision. However, modern steppers can step a mask within 10 seconds making the reticle change throughput penalty relatively small.

While the invention has been particularly shown and described with respect to preferred embodiments thereof, it will be understood by those skilled in the art that changes in form and details may be made therein without departing from the scope and spirit of the invention.

What is claimed is:

1. A method for resolving conflicts between a first original opening and an adjacent second original opening of an alternating phase shifting mask, said original openings respectively defining first and second adjacent electromagnetic radiation application regions (EARs) on a surface to be irradiated, comprising the steps of:

forming a split mask having a plurality of openings defining areas within said first EAR, said plurality of openings including at least one phase shifted opening and at least one non-phase shifted opening;

projecting electromagnetic radiation through said plurality of openings of said split mask onto said surface, during a first exposure, to form at least two EARs within said first EAR, with one of said two EARs being phase shifted and one being non-phase shifted;

forming at least one cover mask, having openings defining at least areas of said first EAR that are not contained within said areas defined by said plurality of openings in the split mask; and projecting electromagnetic radiation through said cover mask openings onto said surface, during a second exposure, to form at least one third EAR which interconnects with said phase shifted and said non-phase shifted EARs.

2. The method as in claim 1, wherein said second exposure occurs prior to said first exposure.

3. The method as in claim 1, wherein during said second exposure a plurality of third EARs are formed and said two EARs are superimposed with said third EARs.

4. The method as in claim 3, wherein certain of said two superimposed EARs are fully contained within certain of said third superimposed EARs.

5. The method as in claim 1, wherein the electromagnetic radiation passing through each of said cover mask openings is of the same phase.

6. The method as in claim 1, wherein the electromagnetic radiation passing through at least two of said cover mask openings is phase shifted.

7. The method as in claim 1, wherein one of said plurality of split mask openings is closely adjacent another one of said plurality of split mask openings.

8. The method as in claim 1, wherein said plurality of split mask openings have widths slightly smaller than said cover mask openings.

9. The method as in claim 1, wherein the split mask and the cover mask are formed on a single mask substrate.

10. A method for overcoming spacing conflicts in alternate phase shifting photolithography, between mask areas defining overlapped openings and conflicting overlapping openings, comprising the steps of:

dividing the areas covered by the overlapping openings into split section openings on a split mask and cover section openings on a cover mask;

forming said split section openings on said split mask in a configuration which substantially eliminates spacing conflicts using alternate phase shifting; and forming at least one cover section opening on said cover mask, said cover section opening containing at least those mask areas of the overlapping openings that are not contained in the split section openings.

11. A photolithographic apparatus for passing electromagnetic radiation onto a surface, utilizing a first mask and a second mask, which masks segment a first original opening having conflicts with a second original opening, comprising:

means in said first mask for passing optical radiation through a plurality of first segmented openings onto at least two first electromagnetic radiation application regions on said surface during a first exposure, said plurality of first segmented openings comprising at least one phase shifted opening and at least one non-phase shifted opening; and means in said second mask for passing optical radiation through a second segmented opening onto one or more second electromagnetic radiation application regions on said surface during a second exposure, such that said second electromagnetic radiation application region interconnects at least one of said phase shifted first electromagnetic radiation application regions and one of said non-phase shifted first electromagnetic radiation application regions.

12. The apparatus as in claim 11, wherein said means in said first and second masks comprise means for superimposing said first electromagnetic radiation application regions with said second electromagnetic radiation application regions.

13. The apparatus as in claim 12, wherein said means in said first and second masks further comprise means for causing certain of said first superimposed electromagnetic radiation application regions to be fully contained within certain of said second superimposed electromagnetic radiation application regions.

14. The apparatus as in claim 11, wherein at least one of said first segmented openings is closely adjacent another of said first segmented openings.

15. The apparatus as in claim 11, wherein said second mask comprises a rim phase shifting mask.

16. The apparatus as in claim 11, wherein said second mask comprises an attenuated phase shifting mask.

17. A method for overcoming spacing conflicts, in alternate phase shifting photolithography, between a first opening and two closely adjacent openings which are phase shifted with respect to each other, comprising the steps of:

dividing said first opening into a plurality of split section openings in a split mask, said split section openings each being phase shifted with respect to one of said closely adjacent openings at a location which is closely adjacent to said one closely adjacent opening; and forming at least one cover section opening in a cover mask, corresponding to at least those mask areas of said first opening that are not contained in said split section openings.

18. The method as in claim 17, wherein said split section openings and said first opening comprise Alt-Rim hybrids.

19. The method as in claim 17, wherein said split section openings and said first opening comprise Alt-Rim-Utt hybrids.

20. The method as in claim 17, wherein said split section openings and said first opening comprise Alt-Att hybrids.

21. The method as in claim 17, wherein said split section openings and said first opening comprise Alt-Att-Utt hybrids.

22. The method as in claim 17, wherein said split section openings and said first opening are alternately phase shifted.

23. In alternate phase shifting photolithography, a first mask and a second mask that overcome spacing conflicts between a first opening and two closely adjacent openings wherein the two closely adjacent openings are phase shifted with respect to each other, comprising:

means in said first mask for dividing said first opening into a plurality of split section openings, said split section openings being each phase shifted with respect to one of said closely adjacent openings at a location which is closely adjacent to said closely adjacent opening; and means in said second mask for defining at least one cover section opening, which opening corresponds to at least those mask areas of the first opening that are not contained in said split section openings.

24. The masks as in claim 23, wherein said first mask is a split mask, said second mask is a cover mask and both of said masks are on a single mask substrate.

* * * * *